(12) United States Patent
Hetzel et al.

(10) Patent No.: US 6,977,427 B2
(45) Date of Patent: Dec. 20, 2005

(54) ELECTRONIC COMPONENT HAVING STACKED SEMICONDUCTOR CHIPS IN PARALLEL, AND A METHOD FOR PRODUCING THE COMPONENT

(75) Inventors: Wolfgang Hetzel, Nattheim (DE); Jochen Thomas, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/723,906

(22) Filed: Nov. 26, 2003

(65) Prior Publication Data

US 2004/0108585 A1 Jun. 10, 2004

(30) Foreign Application Priority Data

Nov. 26, 2002 (DE) .............................. 102 55 289

(51) Int. Cl.[7] ...................... H01L 23/495; H01L 23/02; H01L 21/44
(52) U.S. Cl. ...................... 257/676; 257/686; 257/696; 257/777; 438/109; 438/123
(58) Field of Search .............................. 257/666, 670, 257/672, 673, 676, 685–688, 692, 696, 723, 257/737, 777–781, 784, 786; 438/107–110, 438/117, 123, 613, 617

(56) References Cited

U.S. PATENT DOCUMENTS

| 5,539,250 | A | 7/1996 | Kitano et al. |
| 5,691,570 | A | 11/1997 | Kozuka |
| 5,804,874 | A | 9/1998 | An et al. |
| 6,087,718 | A | 7/2000 | Cho |
| 6,303,981 | B1 | 10/2001 | Moden |
| 6,483,181 | B2 * | 11/2002 | Chang et al. ............... 257/686 |
| 6,593,649 | B1 * | 7/2003 | Lin et al. .................. 257/697 |

FOREIGN PATENT DOCUMENTS

| DE | 197 47 105 A1 | 7/1998 |
| DE | 100 03 670 A1 | 8/2001 |
| SG | 74657 A1 | 8/2000 |

* cited by examiner

Primary Examiner—Hung Vu
(74) Attorney, Agent, or Firm—Laurence A. Greenberg; Werner H. Stemer; Ralph E. Locher

(57) ABSTRACT

An electronic component has a chip stack with a first semiconductor chip, a second semiconductor chip, and a large number of flat conductors configured in between the first semiconductor chip and the a second semiconductor chip. The flat conductors have a central section on which the semiconductor chips are mounted. First bonding connections connect the first semiconductor chip to inner sections of the flat conductors. Second bonding connections connect the second semiconductor chip to transitional sections of the flat conductors. The outer sections of the flat conductors project out of a package.

10 Claims, 4 Drawing Sheets

ELECTRONIC COMPONENT HAVING STACKED SEMICONDUCTOR CHIPS IN PARALLEL, AND A METHOD FOR PRODUCING THE COMPONENT

BACKGROUND OF THE INVENTION

Field of the Invention

The invention relates to an electronic component having stacked semiconductor chips in a parallel arrangement, and to a method for producing the electronic component using a flat conductor frame.

Stacking semiconductor chips, in order to achieve greater circuit and/or memory density, requires a complex adaptation to the layout of the individual semiconductor chips. When semiconductor chips are stacked by arranging their rear faces on one another, either mirror-image layouts are provided for the semiconductor chips, or bonding connections must be arranged in a complex manner, crossing over one another, or correspondingly complex interposer films have to provide the mirror-image configuration. This complexity cannot be overcome by mutually arranging the active upper faces of the semiconductor chips.

SUMMARY OF THE INVENTION

It is accordingly an object of the invention to provide an electronic component and a method for producing the electronic component, which overcome the above-mentioned disadvantages of the prior art apparatus and methods of this general type.

In particular, an object of the invention is to provide an electronic component which has a simple and cost-effective arrangement for stacked semiconductor chips.

With the foregoing and other objects in view there is provided, in accordance with the invention, an electronic component that has a chip stack with a first semiconductor chip and a second semiconductor chip. Furthermore, the electronic component has a large number of flat conductors with an inner section, a central section, a transitional section, and an outer section. Furthermore, the electronic component has a package in which the chip stack is packed and from which the outer sections of the flat conductors project. The inner sections and the central sections of the flat conductors are arranged between the two semiconductor chips. In addition, bonding surfaces on the first semiconductor chip are connected via first bonding connections to inner sections of the flat conductors. Bonding surfaces on the second semiconductor chip are connected via second bonding connections to the transitional sections of the flat conductors.

An electronic component such as this has the advantage that two completely identical semiconductor chips can be stacked one on top of the other, without any need to provide complex changes to the layout for the semiconductor chips which are to be stacked one on top of the other. Only the first and the second bonding connections differ from one another, in that the first bonding connection extends to the respective inner section of a flat conductor, and the second bonding connection for the second semiconductor chip extends to the transitional section of a flat conductor. This avoids complex crossings of the bonding connections, and there is likewise no need for mirror-image arrangements of the bonding surfaces on the first semiconductor chip with respect to the bonding surfaces on the second semiconductor chip. In fact, the first and the second bonding connections of the first and the second semiconductor chip are electrically connected to an inner section and, respectively, to a transitional section of the same flat conductor. This flat conductor thus connects electrodes having the same effect of the two semiconductor chips.

The bonding surfaces on the first and on the second semiconductor chip can be arranged at mutually congruent positions. This has the advantage that the functionality of the two semiconductor chips can be tested using identical test tools before they are assembled to form a chip stack, and that there is no need whatsoever for any reprogramming of the test procedure or of the test tool. This capability for testing using identical systems for both the first and the second semiconductor chip before stacking has the advantage that the chip stack allows a considerably higher yield of functional stacks. If no such capability exists, then the individual yield for the respective semiconductive chip is included with a square law in the overall yield for the stack.

If the bonding surfaces on the first and on the second semiconductor chip are arranged in central bonding channels, then it is advantageous for the semiconductor chips to have bonding channels which are arranged such that they cover an area and are congruent to one another. This also simplifies the association between the first and the second bonding connections and the inner sections and, respectively, the transitional sections of the flat conductors during the assembly and bonding of the chip stacks in a flat conductor frame. The bonding pads may be arranged on one or more sides within the bonding channels. A further improvement in the reliability and in the capability to test individual semiconductor chips before stacking is achieved if the two semiconductor chips have an identical interposer level. This interposer level can be formed by an interposer for wire bonding, by a tape for lead bonding, or by a thin film/redistribution for wafer level packaging. The resulting spreading out of the contacts of the semiconductor chip makes it easier to use test needles to access an external test set at times.

A safe testing capability can be ensured by ensuring the connection via interposer lines between the bonding surfaces and the interposer level by using encapsulation in the form of a protective layer. A protective layer such as this can be produced by printing, molding, dispensing, or deposition. In order to achieve simple and effective stacking for first and second semiconductor chips with a central bonding channel and rows of bonding surfaces arranged alongside one another, the active upper face of the first semiconductor chip is mounted on central sections of flat conductors, and the rear face of the second semiconductor chip is fitted to these central sections. In this case, the central sections of the flat conductors are arranged between the two semiconductor chips. Both the first semiconductor chip and the second semiconductor chip are thus connected to the corresponding sections of the associated flat conductors in a simple manner, without having to provide mirror-image positions for the bonding surfaces and without having to provide crossing bonding wires.

The outer sections of the flat conductors that project out of the package may have a z-shaped bend, which is aligned such that the active upper faces of the semiconductor chips are aligned in the direction of the bend. This results in an electronic component with a chip stack in which a so-called "face down" structure is produced, and in which the active upper faces of the semiconductor chips are aligned with the lower face of the electronic component. Bending the outer sections of the flat conductors in the opposite direction results in a so-called "face up" structure, in which the active upper faces of the semiconductor chips are aligned in the direction of the upper face of the electronic component.

These two structures may be of critical importance to the heat budget of the electronic component, in particular if the electronic component has a heat sink that is fitted to the package.

It is also possible within the packaging for the transitional section of the flat conductors to have a bend in the direction of the active upper face of the second semiconductor chip. An inner bend of the flat conductor in this way in the region of the transitional section has the advantage that, on the one hand, this improves the anchorage of the flat conductor in the package and, on the other hand, the bonding surface on the transitional section is raised to the level of the active upper face of the second semiconductor chip. The bonding wire length of the second bonding connection is shortened. Another advantage is that bonding is possible between the second semiconductor chip and the transitional section of the flat conductor at the same level.

With the foregoing and other objects in view there is also provided, in accordance with the invention, a method for producing an electronic component having a chip stack. First of all, a first and a second semiconductor chip with bonding surfaces, which are arranged congruently, are provided for a chip stack. Functional tests are then carried out separately for each of the semiconductor chips. This is done by making contact between a test tool and two or more bonding surfaces during the functional test, and needles or balls can be used for this purpose.

If the bonding surfaces are not arranged directly in the bonding channel, but on an interposer level, then the contact can be made via the bonding surfaces on the interposer level. During the test, the rest of the active upper face or bonds of the semiconductor chip, in particular in the bonding channel, can be protected by using an encapsulation layer. This encapsulation layer may be produced by printing, molding, dispensing or deposition, leaving the bonding surfaces free. The encapsulation layer on the first semiconductor chip may at the same time be used during the assembly of the stack for mechanically fixing the second semiconductor chip that is arranged above it.

Once the functional tests have been carried out separately on the two semiconductor chips, this considerably improves the probability that the electronic component with the chip stack will be functional. After a successful functional test, the functionally tested first semiconductor chips are aligned and are fixed on one face of the central sections of the flat conductors, in a component position in a flat conductor frame.

In order to keep the height of the component small and to save costs, additional chip islands, to which the semiconductor chips are fitted, are dispensed with. The first semiconductor chip is thus supported merely by one face of the central sections of a large number of flat conductors. The first bonding connection is then produced between the bonding surfaces on the first semiconductor chip and corresponding inner sections of the flat conductors. It is thus possible to cost-effectively use an only slightly modified process flow, as is already used for flat conductor frame techniques that do not involve stacking, for the solution according to the invention with "both semiconductor chips at the top", as well.

Once the first, lower semiconductor chip has been fitted, the second, upper semiconductor chip is fixed on an opposite face of the central sections of the flat conductors. For this purpose, the rear face of the second semiconductor chip is mounted on these central sections. After this, second bonding connections are produced between the bonding surfaces on the second semiconductor chip and corresponding transitional sections of the flat conductors. Finally, this structure is molded. For this purpose, the chip stack with the bonding connections and the flat conductors at component positions in a flat conductor frame is packed into a plastic encapsulation compound, leaving outer sections of the flat conductors of the flat conductor frame projecting.

There is therefore a chip stack according to the invention at each component position in the flat conductor frame, thus achieving twice the circuit density and twice the memory density without exceeding the standard package height of 1.2 mm. For this purpose, an adhesive film is used for adhesively bonding the semiconductor chips to the central sections of the flat conductors. This adhesive film has a thickness of only a few micrometers.

Once the chip stacks have been packaged, the component positions are stamped out of the flat conductor frame, bending the outer sections. During this stamping-out process, cross-connection and holding webs between the flat conductors, which are used to make the flat conductor frame robust, are cut through at the same time. The direction of the bend depends on whether the intention is to produce a "face up" structure or a "face down" structure.

A further method variant provides for an interposer film or interposer layer to be fitted to the active upper face of the first and of the second semiconductor chip before the assembly process. This interposer film has interposer lines and has larger bonding surfaces than are possible in the central bonding channel.

These interposer lines on the active upper face of the semiconductor chip are electrically connected by contacts to contact surfaces in the central bonding channel. Instead of bent interposer lines, additional bonding wires for additional bonding connections can also be provided here. In this case, the interposer film has an interposer structure that has bonding surfaces for connection to the flat conductors, and has interposer lines which lead from these bonding surfaces to bonding fingers. In this case, the bonding fingers are arranged in the edge area of the central bonding channel, and the additional bonding connections lead from these bonding fingers to the contact surfaces in the central bonding channel of the semiconductor chips.

In summary, it can be stated that the inventive solution makes it possible to achieve an increase in the memory density by stacking, while the overall height of the standard packages remains the same. Furthermore, semiconductor chips with double-row bonding surfaces can be used in the stack, without any need for mirror-image layouts for the second semiconductor chip in the stack. The congruence of the bonding surface positions furthermore makes it possible to test the functionality of each individual semiconductor chip, before assembly, using conventional test tools and test systems, thus improving the yield for the electronic component with a chip stack.

Other features which are considered as characteristic for the invention are set forth in the appended claims.

Although the invention is illustrated and described herein as embodied in an electronic component having stacked semiconductor chips in a parallel arrangement, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
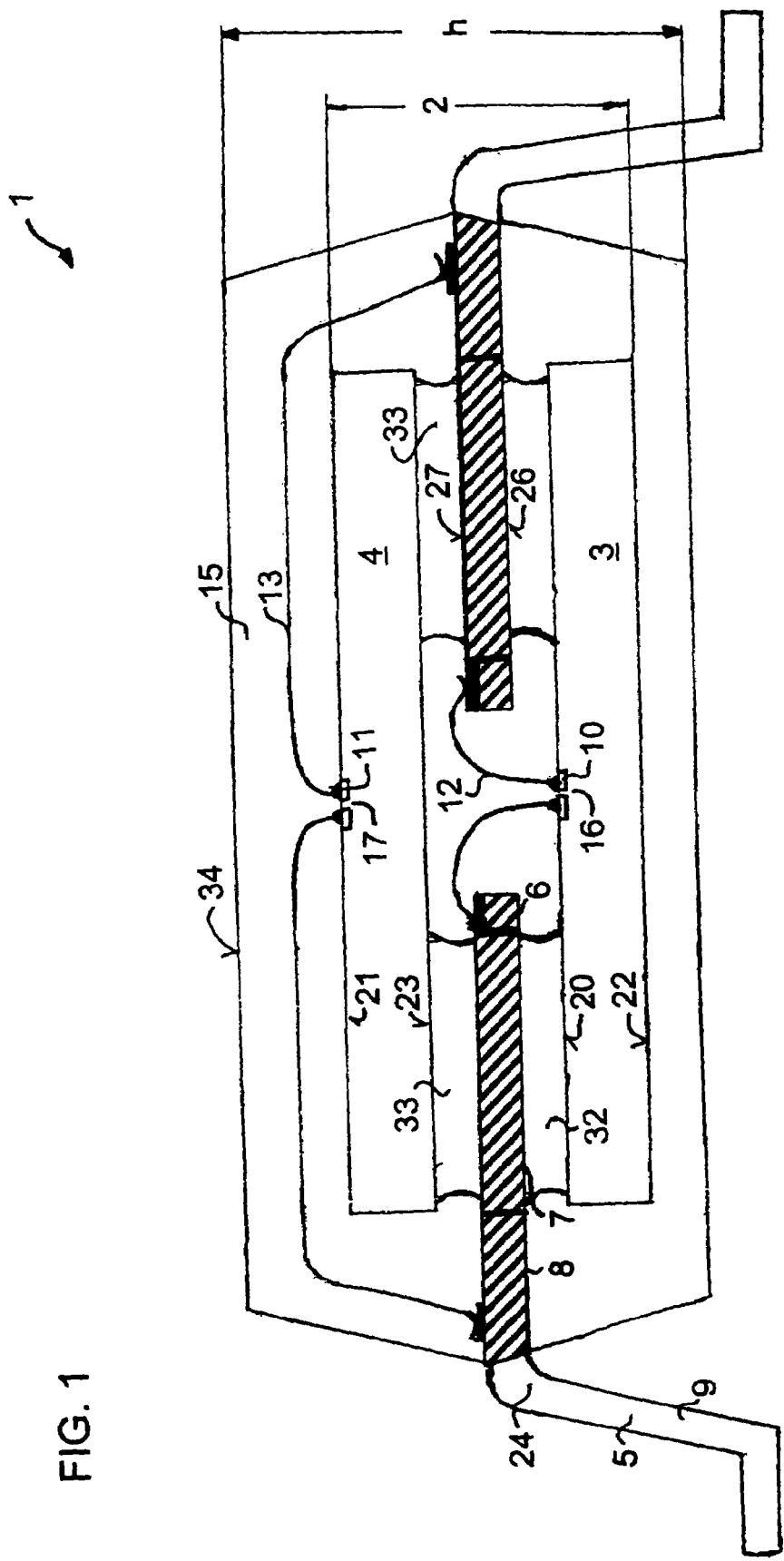
FIG. 1 is a schematic cross sectional view through a first embodiment of an electronic component.

Referring now to the figures of the drawing in detail and first, particularly, to FIG. 1 thereof, there is shown a schematic cross sectional view through a first embodiment of an electronic component 1. A chip stack 2 is arranged in a package 15 composed of a plastic compound. This chip stack 2 has a first semiconductor chip 3 and a second semiconductor chip 4 which, in this first embodiment of the invention, form a "both chips at the top" structure. The first semiconductor chip 3, which is the lower chip in this embodiment, is adhesively bonded by its active upper face 20 to central sections 7 of a large number of flat conductors 5. These flat conductors also have an inner section 6, a transitional section 8 and an outer section 9. The outer section 9 projects out of the package 15. The transitional section 8 extends into the package 15. The inner section 6 and the central section 7 are arranged between the semiconductor chips 3 and 4.

An adhesive film 32 mechanically connects the upper face 20 of the first semiconductor chip 3 to one face of the central section 7. A further adhesive film 33 connects the opposite face of the central section 7 to a rear face 21 of the second semiconductor chip 4. The two semiconductor chips 3 and 4 are identical, and have an elongated bonding channel 16 or 17, respectively, in their center. These bonding channels 16 and 17 have bonding surfaces 10 and 11 which are arranged in two rows alongside one another. The bonding surfaces 10 and 11 on the first and second semiconductor chips 3 and 4 are arranged in the corresponding bonding channels 16 and 17 such that they cover one another and are congruent. This congruent arrangement of the bonding surfaces simplifies the bonding process in the configuration with a chip stack 2 as illustrated in FIG. 1.

In the embodiment of the invention illustrated in FIG. 1, the bonding wire length of the first bonding connection 12 is considerably shorter than the bonding wire length of the second bonding connection 13, since the first bonding connection is connected between bonding surfaces 10 of the bonding channel 16 to inner sections 6 of the flat conductors 5, and the bonding wire for the second bonding connection 13 has to cover the distance between the bonding channel 17 of the second electronic component 4 and the transitional sections 8 of the flat conductors 5.

The package thickness h is 1.2 mm, and is therefore no greater than the standard package thickness of electronic components with only one semiconductor chip in the package. The outer sections 9 of the large number of flat conductors 5 have a z-shaped bend 24 which, in this embodiment as shown in FIG. 1, is bent downwards such that the active upper faces 20 and 21 of the semiconductor chips 3 and 4 are aligned in the direction of the upper face 34 of the package 15. A structure such as this is also referred to as a "face up" structure.

The electronic component 1 as shown in FIG. 1 is produced in a process flow which differs slightly from the processing of semiconductor chips which are not stacked in electronic components. Adhesive films 32 and 33, which are adhesively bonded on both sides, are applied to a flat conductor frame with two or more component positions and flat conductors 5. The lower semiconductor chip 3 is fitted first of all. Electrical contact is then made using wire bonds between bonding surfaces 10 on the first, lower semiconductor chip 3 and inner sections 6 of the flat conductors 5. After this, the upper, second semiconductor chip 4 is fixed on the adhesive film 33, and likewise makes electrical contact with transitional sections 8 of the flat conductors 5 by using bonding wires. The structure is then molded, with the package 15 being produced.

An estimate of the overall height of the electronic component with a chip stack 2 shows that the thickness h of the molded body need not be changed from that of the standard package heights. Before the installation of the two semiconductor chips 3 and 4, they are tested for their functionality, so that only functional semiconductor chips are considered for the formation of a chip stack.

Figure 2:
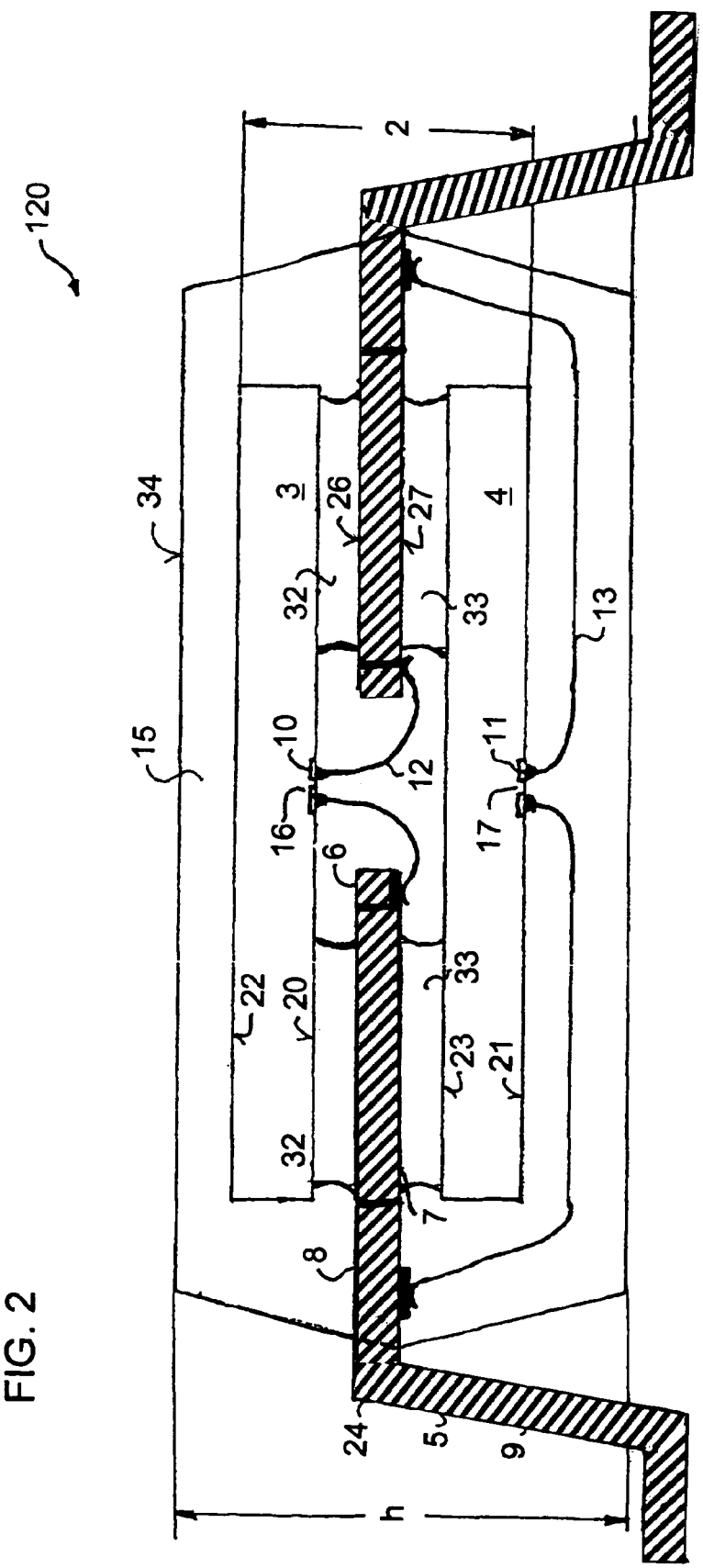
FIG. 2 is a schematic cross sectional view through a second embodiment of the electronic component.

FIG. 2 is a schematic cross sectional view through a second embodiment of an electronic component 120. Components in the following FIGS. 2 to 4 which have the same functions as in FIG. 1 are identified by the same reference symbols and will not be explained again. One difference between the first embodiment of the invention as shown in FIG. 1 and the second embodiment as shown in FIG. 2 is that the bend 24 in the outer sections 9 of the flat conductors 5 is in the opposite direction to the bend 24 in FIG. 1. The active faces 20 and 21 of the chip 3 and of the chip 4 are aligned downwards with respect to the component contact. This therefore results in a "face down" structure in FIG. 2. A "face down" structure such as this can be cooled intensively from the rear face of the first semiconductor chip 3, if an additional heat sink, which is not shown in this view, is arranged on the upper face 34 of the package 15.

Figure 3:
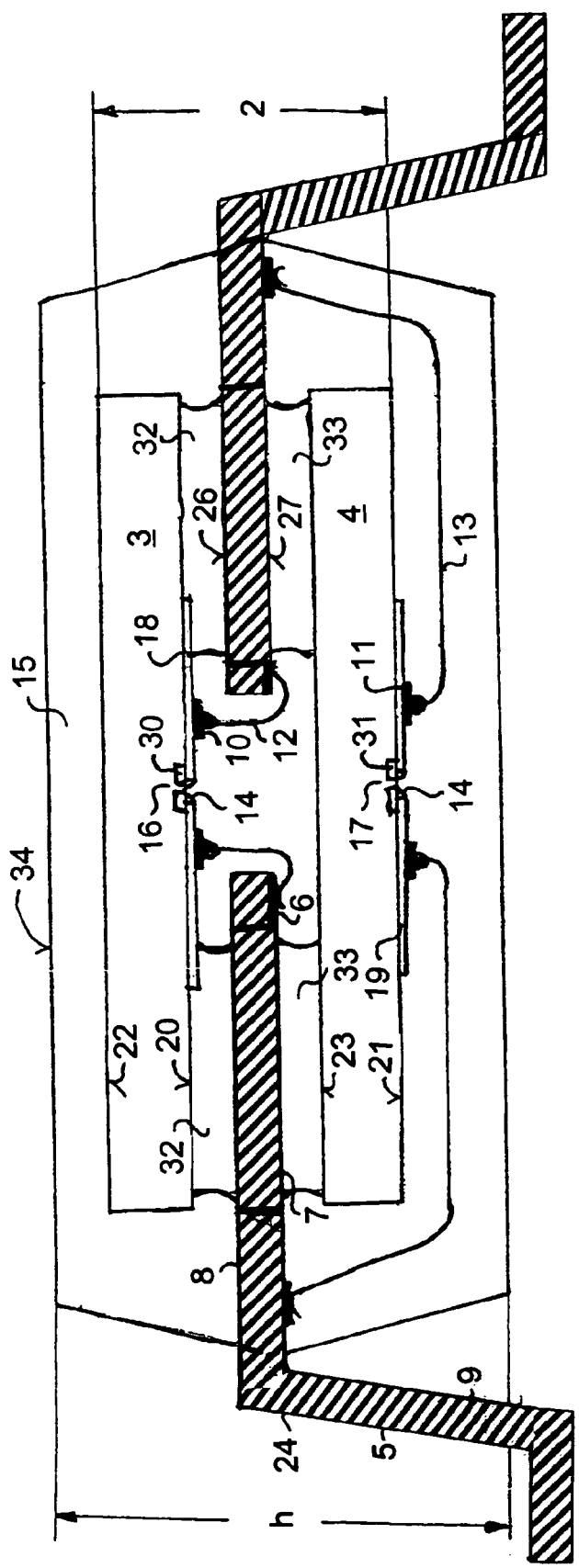
FIG. 3 is a schematic cross sectional view through a third embodiment of the electronic component.
Figure 4:
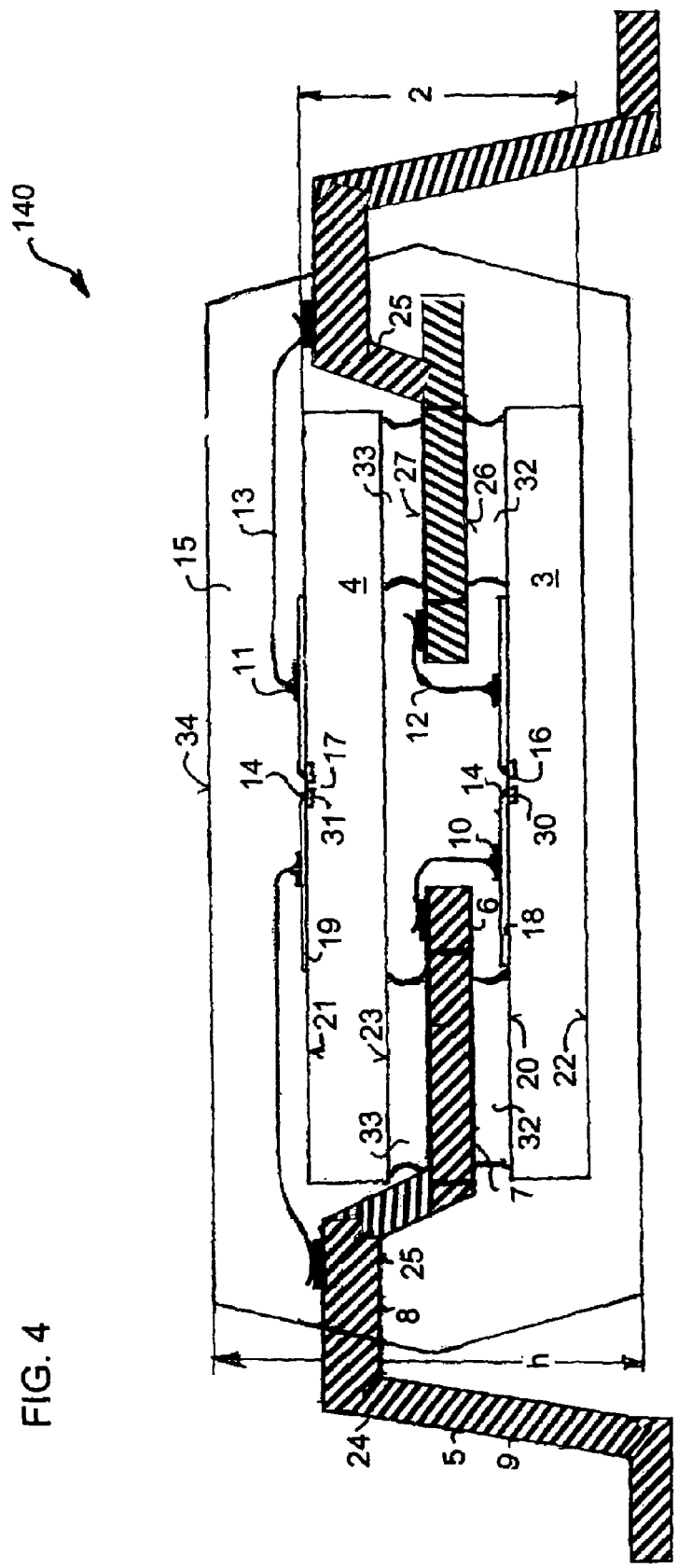
FIG. 4 is a schematic cross sectional view through a fourth embodiment of the electronic component.

FIG. 3 is a schematic cross sectional view through a third embodiment of an electronic component 130. The embodiment shown in FIG. 3 differs from the previous embodiments shown in FIGS. 1 and 2 in that the contact surfaces 30 and 31 in the bonding channels 16 and 17 are connected via a bonding connection 14 to a respective interposer level 18 or 19, on which larger bonding areas 10 and 11 are located for the first and second bonding connections 12 and 13. This results in the contact surfaces being spread out, which makes it easier to functionally test each individual semiconductor chip 3 and 4 using the same test tool before being assembled to form a chip stack 2, thus improving the yield of functional components 1 with the chip stack 2. The additional bonding connection 14 in the embodiment shown in FIG. 3 is formed by interposer lines that extend as far as the active upper faces 20 and 21, respectively, in the respective bonding channel 16 or 17. While FIG. 3 shows an exemplary embodiment of a "face down" structure, FIG. 4 shows a "face up" structure. The interposer level 18, 19 is in this case an additional interposer, that is to say a printed circuit board material with a copper layer. In embodiments which are not described here, it is a tape material with an interconnect, with which contact is made using a tape automated bonding method, or a single metallization layer on the chip surfaces which have been passivated.

FIG. 4 is a schematic cross sectional view through a fourth embodiment of an electronic component 140. One difference in the embodiment shown in FIG. 4 from the embodiment shown in FIG. 3 is that, in addition to the reversal of the alignments in the semiconductor chips, an additional bend 25 is provided for the transitional sections 8 within the package 15 that is composed of plastic. This bend 25 is arranged in the direction of the active upper face 23 of the second semiconductor chip 4, so that the length of the bonding wire for the second bonding connection 13 is shorter than the bonding wire for the third embodiment as shown in FIG. 3. Furthermore, the length of the second bonding connection 13 is shortened by the arrangement of bonding surfaces 11 on an interposer level. In addition, the bend in the transitional section 8 results in an improved anchoring of the flat conductor 5 in the package 15, which is composed of plastic.

We claim:

1. An electronic component, comprising:
    a chip stack including a first semiconductor chip having an active surface and a second semiconductor chip having an active surface;
    a plurality of flat conductors, each one of said plurality of flat conductors including an inner section, a central section, a transitional section, and an outer section, said inner section of each one of said plurality of flat conductors and said central section of each one of said plurality of flat conductors configured between said first semiconductor chip and said second semiconductor chip;
    a package;
    a plurality of first bonding connections; and
    a plurality of second bonding connections;
    said first semiconductor chip having a plurality of contact surfaces;
    said second semiconductor chip having a plurality of contact surfaces;
    said contact surfaces of said first semiconductor chip and said second semiconductor chip being disposed at mutually congruent positions;
    a first interposer layer or interposer film configured on said active surface of said first semiconductor chip, said first interposer layer or interposer film having first bonding fingers, first interposer lines and first bonding surfaces; and
    a second interposer layer or interposer film configured on said active surface of said second semiconductor chip, said second interposer layer or interposer film having second bonding fingers, second interposer lines and second bonding surfaces;
    each one of said plurality of first bonding connections connecting one of said first bonding surfaces on said first interposer layer or interposer film to said inner section of one of said plurality of flat conductors; and
    each one of said plurality of second bonding connections connecting one of said second bonding surfaces on said second interposer layer or interposer film to said transitional section of one of said plurality of flat conductors.

2. The electronic component according to claim 1, wherein:
    one of said plurality of first bonding connections is connected to said inner section of a given one of said plurality of flat conductors; and
    one of said plurality of second bonding connections is connected to said transitional section of said given one of said plurality of flat conductors.

3. The electronic component according to claim 1, wherein:
    said plurality of said first bonding surfaces on said first interposer layer or interposer film and said plurality of said second bonding surfaces on said second interposer layer or interposer film are configured at mutually congruent positions.

4. The electronic component according to claim 1, wherein:
    said first semiconductor chip includes a bonding channel and said second semiconductor chip includes a bonding channel congruently configured with respect to said bonding channel of said first semiconductor chip;
    said plurality of bonding surfaces on said first semiconductor chip are configured in said bonding channel of said first semiconductor chip; and
    said plurality of bonding surfaces on said first semiconductor chip are configured in said bonding channel of said first semiconductor chip.

5. The electronic component according to claim 1, wherein:
    said active surface of said first semiconductor chip is mounted on said central section of each one of said plurality of flat conductors; and
    said active surface of said second semiconductor chip is mounted on said central section of each one of said plurality of flat conductors.

6. The electronic component according to claim 1, wherein:
    said outer section of each one of said plurality of flat conductors has a z-shaped bend aligned such that said active surface of said first semiconductor chip and said active surface of said second semiconductor chip are aligned in a direction of the bend.

7. The electronic component according to claim 1, wherein:
    said outer section of each one of said plurality of flat conductors has a z-shaped bend aligned such that said active surface of said first semiconductor chip and said active surface of said second semiconductor chip are aligned in a direction opposite the bend.

8. The electronic component according to claim 1, wherein:
    said transitional section of each one of said plurality of flat conductors has a bend toward said active surface of said second semiconductor chip.

9. A method for producing an electronic component, the method which comprises:
    providing a first semiconductor chip having an active surface and a plurality of contact surfaces and a second semiconductor chip having an active surface and a plurality of contact surfaces, the first semiconductor chip and the second semiconductor chip being for a chip stack, the contact surfaces of the first semiconductor chip and the second semiconductor chip being disposed at mutually congruent positions;
    providing a plurality of flat conductors, each one of the plurality of flat conductors including an inner section, a central section, a transitional section, and an outer section, the inner section of each one of the plurality of flat conductors and the central section of each one of the plurality of flat conductors configured between the first semiconductor chip and the second semiconductor chip;
    providing a plurality of first bonding connections and a plurality of second bonding connections;

fitting a first interposer layer or interposer film to the active surface of the first semiconductor chip, the first interposer layer or interposer film having first bonding fingers, first interposer lines and first bonding surfaces;

fitting a second interposer layer or interposer film to the active surface of the second semiconductor chip, the second interposer layer or interposer film having second bonding fingers, second interposer lines and second bonding surfaces;

connecting one of the first bonding surfaces on the first interposer layer or interposer film to the inner section of one of the plurality of flat conductors though each one of the plurality of first bonding connections;

connecting one of the second bonding surfaces on the second interposer layer or interposer film to the transitional section of one of the plurality of flat conductors through each one of the plurality of second bonding connections; and packaging a chip stack formed by the first semiconductor chip, the second semiconductor chip, the plurality of first bonding connections, the plurality of second bonding connections, and the plurality of flat conductors in a plastic encapsulation compound, leaving outer sections of the flat conductors of the flat conductor frame projecting.

10. The method according to claim 9, which further comprises:

after the chip stack has been packaged, stamping out the component position from the flat conductor frame, and bending the outer section of the plurality of flat conductors.

* * * * *